(12) United States Patent
Akiba

(10) Patent No.: US 6,711,030 B2
(45) Date of Patent: Mar. 23, 2004

(54) INTERCONNECTING METHOD OF WIRING IN PRINTED CIRCUIT BOARDS AND PRINTED CIRCUIT BOARD UNIT

(75) Inventor: Akihiro Akiba, Yamagata (JP)

(73) Assignee: NEC Corporation, Tokyo (JP)

( * ) Notice: Subject to any disclaimer, the term of this patent is extended or adjusted under 35 U.S.C. 154(b) by 70 days.

(21) Appl. No.: 10/008,841

(22) Filed: Nov. 13, 2001

(65) Prior Publication Data

US 2002/0060906 A1 May 23, 2002

(30) Foreign Application Priority Data

Nov. 21, 2000 (JP) .................................... 2000-354350

(51) Int. Cl.$^7$ ................................................ H05K 1/14
(52) U.S. Cl. ................ 361/803; 361/785; 361/790; 361/804; 174/262; 174/267
(58) Field of Search .................... 361/785, 790, 361/791, 799, 801–804; 439/74, 75; 257/691; 174/138 D, 138 G, 262, 264, 267

(56) References Cited

U.S. PATENT DOCUMENTS

| | | | |
|---|---|---|---|
| 4,929,185 A | * 5/1990 | Wong et al. | .................. 439/74 |
| 5,130,894 A | * 7/1992 | Miller | ........................ 361/735 |
| 5,380,211 A | * 1/1995 | Kawaguchi et al. | .......... 439/74 |
| 5,536,177 A | * 7/1996 | Casey | .......................... 439/74 |
| 6,472,613 B1 | * 10/2002 | Reichard | .................... 174/261 |

* cited by examiner

*Primary Examiner*—John B. Vigushin
(74) *Attorney, Agent, or Firm*—Dickstein, Shapiro, Morin & Oshinsky, LLP.

(57) ABSTRACT

A printed circuit board unit has smaller number of pins in connectors for connection of wiring (signal lines and power source lines) between a plurality of printed circuit boards for increasing mounting space of the board and interconnection method of wiring between printed circuit boards. The printed circuit board unit includes a plurality of printed circuit boards having wiring formed thereon, a part of the wiring on the printed circuit boards electrically connected through connectors, a screw formed of electrically conductive body and fixing the plurality of printed circuit boards with preventing the connectors from disengaging from each other, and remaining part of the wiring on the printed circuit boards electrically connected through the screw.

8 Claims, 7 Drawing Sheets

INTERCONNECTING METHOD OF WIRING IN PRINTED CIRCUIT BOARDS AND PRINTED CIRCUIT BOARD UNIT

BACKGROUND OF THE INVENTION

1. Field of the Invention

The present invention relates generally to an electrical equipment. More particularly, the invention relates to a method for connecting wiring, such as power source lines, signal lines and so forth of a plurality of printed circuit boards with each other and a printed circuit board unit with a plurality of printed circuit boards established connection.

2. Description of the Related Art

In the conventionally realized printed circuit board unit, a main board 51 and a subsidiary board 52 are connected through a connector 53 and a connector 54, and the main board 51 and the subsidiary board 52 are secured by a screw 55 so as to prevent disengagement of the connectors 53 and 54 as shown in terms of an example of personal computer in FIGS. 6A and 6B. In the shown personal computer, a power source current 56 flowing out from a power source IC 60 of the subsidiary board 52 flows into a load circuit A61 on the subsidiary board 52 through a power source pattern 57 and to a pin 59 of the connector 53, as shown in FIGS. 7A and 7B. The current flowing into the pin 59 is supplied into a load circuit B62 and a load circuit C63 by a power source pattern 58 of the main board 51 through the connector 53 and the connector 54. In these figures, only connection of the power source lines is illustrated. However, the signal lines are connected through the connectors in similar manner as the power source lines.

In the conventional printed circuit board unit set forth above, the power source lines and the signal lines used in common in the subsidiary board and the main board are connected only by the connectors. Number of pins in the connector becomes larger to require greater space.

SUMMARY OF THE INVENTION

The present invention has been worked out in view of the problem set forth above. Therefore, it is an object of the present invention to provide a printed circuit board unit which has smaller number of pins in connectors for connection of wiring (signal lines and power source lines) between a plurality of printed circuit boards for increasing mounting space of the board and interconnection method of wiring between printed circuit boards.

According to one aspect of the present invention, an interconnection method of wiring of printed circuit boards for interconnecting wiring of a plurality of printed circuit boards of electrical equipment, comprises:

step of electrically connecting a part of wiring of the printed circuit boards with each other by connectors; and step of electrically connecting remaining portion of wiring of the printed circuit boards with each other by a screw formed of an electrically conductive body in conjunction with fixing the printed circuit boards by the screw.

According to another aspect of the present invention, a printed circuit board unit comprises:

a plurality of printed circuit boards having wiring formed thereon;

a part of the wiring on the printed circuit boards electrically connected through connectors;

a screw formed of electrically conductive body and fixing the plurality of printed circuit boards with preventing the connectors from disengaging from each other; and remaining part of the wiring on the printed circuit boards electrically connected through the screw.

In practice, power source lines and/or signal lines of the printed circuit boards are electrically connected with each other by the screw.

With the present invention, the screw for fixing a plurality of printed circuit boards is used as a part of wiring to reduce number of pins of the connectors to increase mounting space on the printed circuit board.

BRIEF DESCRIPTION OF THE DRAWINGS

The present invention will be understood more fully from the detailed description given hereinafter and from the accompanying drawings of the preferred embodiment of the present invention, which, however, should not be taken to be limitative to the invention, but are for explanation and understanding only.

In the drawings.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structure are not shown in detail in order to avoid unnecessary obscurity of the present invention.

Figure 1:
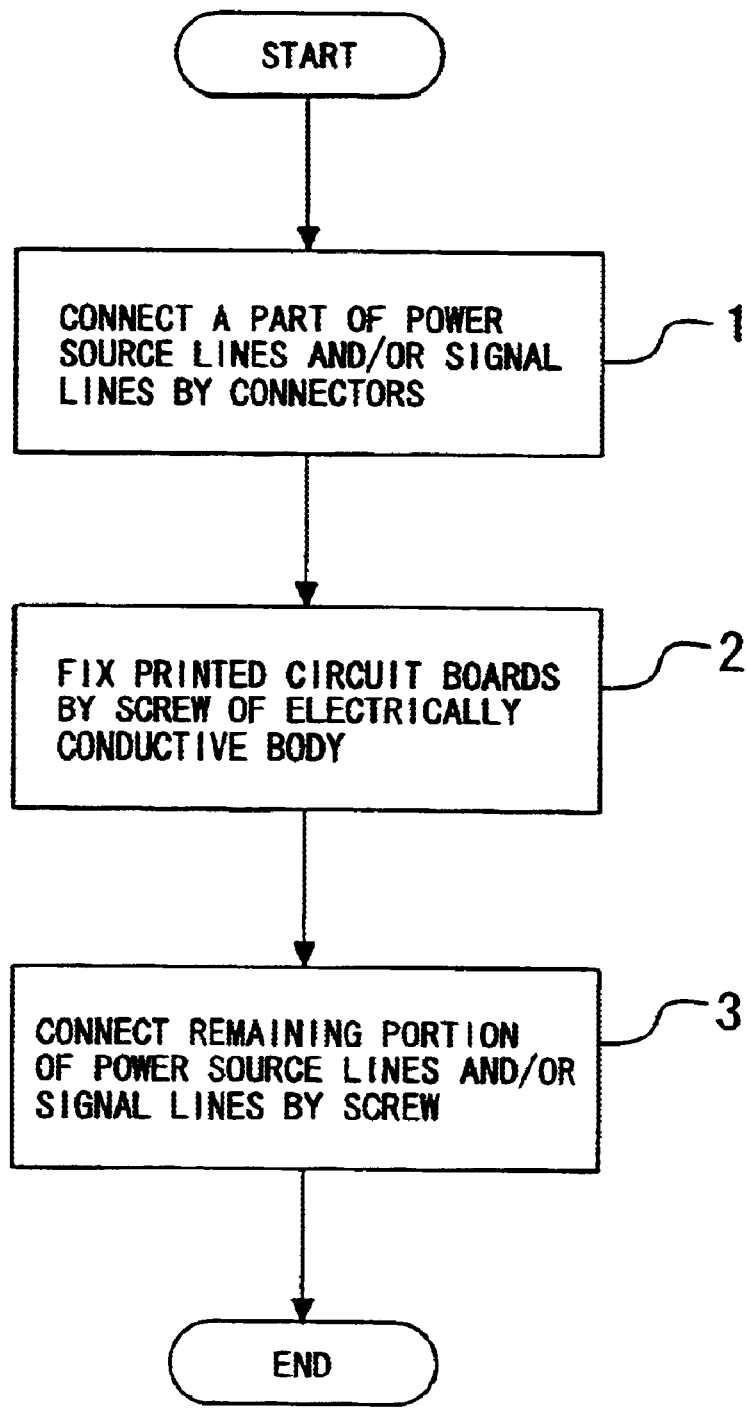
FIG. 1 is a flowchart of one embodiment of an interconnection method of wiring on printed circuit boards according to the present invention.

FIG. 1 is a flowchart of one embodiment of connection method according to the present invention.

As shown in FIG. 1, in one embodiment of the connection method according to the present invention, electrical interconnection of wiring of a plurality of printed circuit boards, namely a part of power source lines and signal lines, is established by connectors (step 1). Next, for preventing the connectors from disengaging, the printed circuit boards are fixed with each other by screw (step 2). Here, by using the screw formed of electrically conductive material, such as metal including, copper, aluminum or the like, remaining part of the power source lines and the signal lines of the printed circuit boards are electrically connected by the electrically conductive screw (step 3).

Figure 2A:
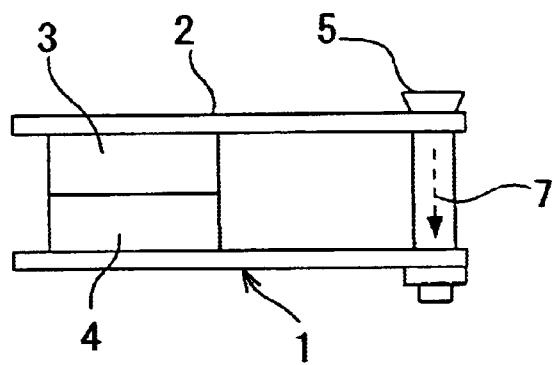
FIG. 2A is a front elevation of the first embodiment of a printed circuit board unit according to the present invention.
Figure 2B:
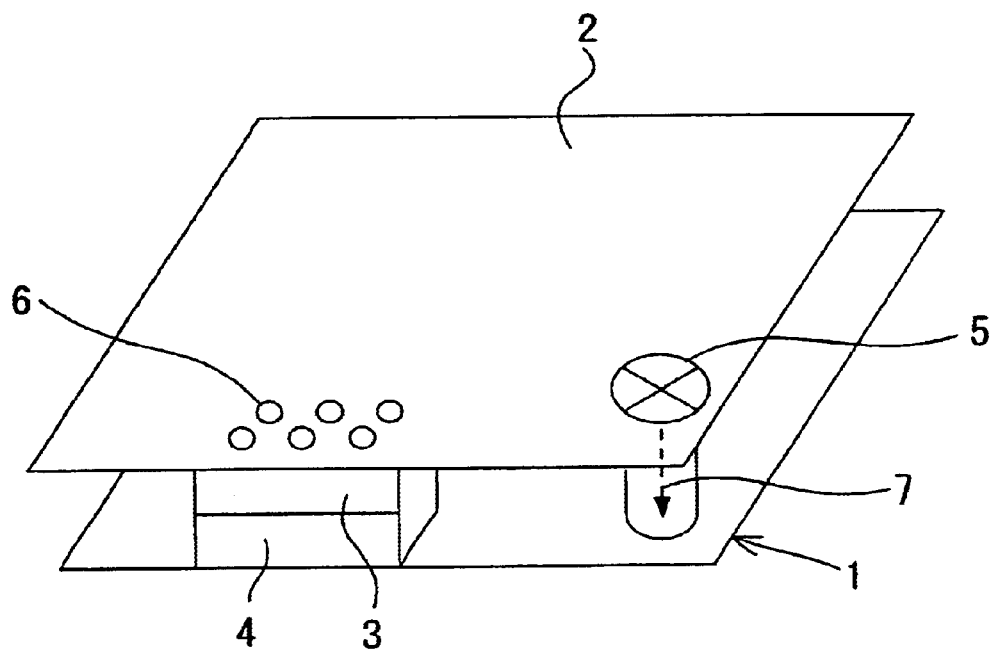
FIG. 2B is an enlarged perspective view of the first embodiment of a printed circuit board unit according to the present invention.
Figure 3A:
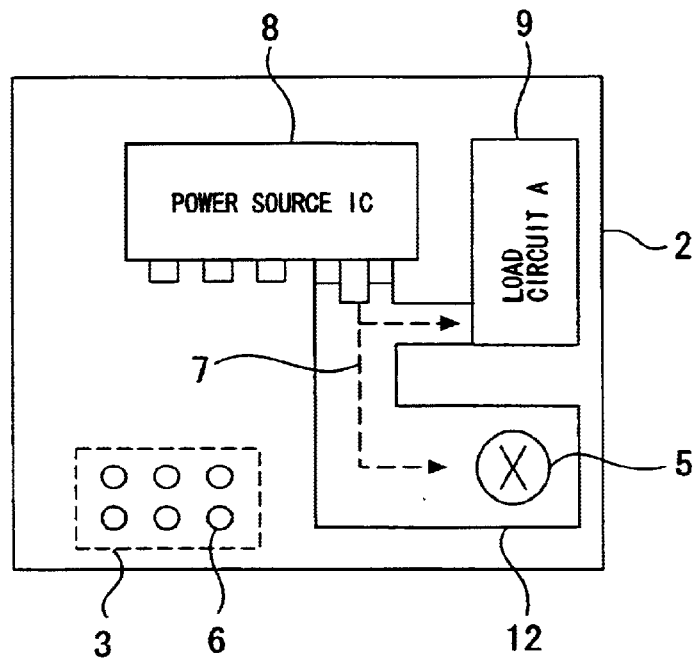
FIG. 3A is a plan view of a subsidiary board 2 of FIG. 2B.
Figure 3B:
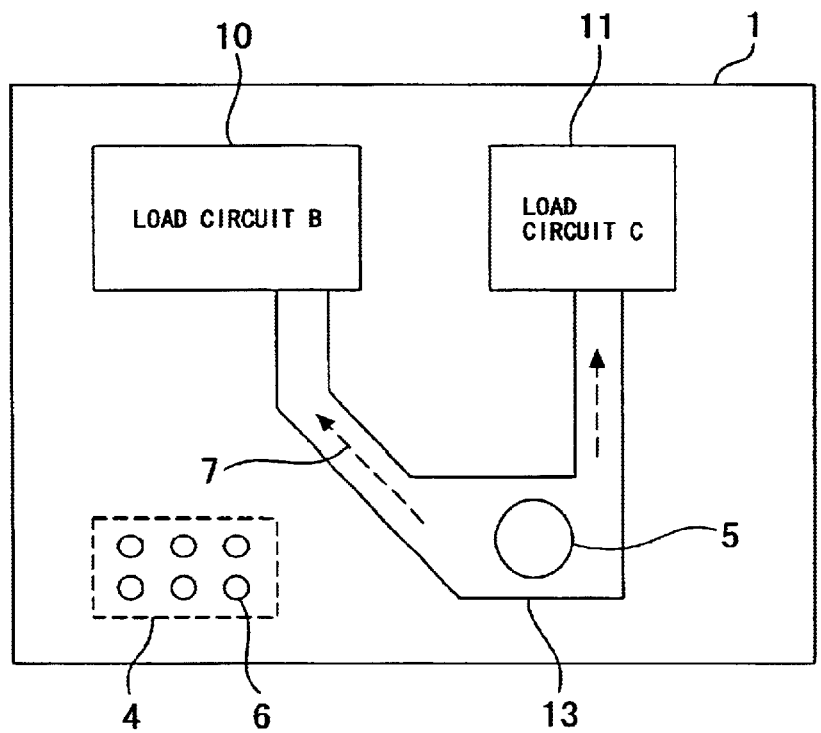
FIG. 3B is a plan view of a main board 1 of FIG. 2B.

FIG. 2A is a front elevation of the first embodiment of a printed circuit board unit according to the present invention, FIG. 2B is an enlarged perspective view of the first embodiment of a printed circuit board unit according to the present invention, FIG. 3A is a plan view of a subsidiary board 2 of FIG. 2B, and FIG. 3B is a plan view of a main board 1 of FIG. 2B.

In the shown printed circuit board unit, two printed circuit boards are electrically connected by the method shown in FIG. 1.

Namely, as shown in FIGS. 2A and 2B, in the printed circuit board unit, connectors 3 and 4 are disposed between a main board 1 and a subsidiary board 2, and the main board 1 and the subsidiary board 2 are fixed with each other by a screw 5. The screw 5 is formed of electrically conductive body. In the shown embodiment, the screw 5 is formed of copper. On the main board 1 and the subsidiary board 2, a load circuit B10, a load circuit C11, a power source IC 8 and a load circuit A9 are formed as shown in FIGS. 3A and 3B, respectively. The connectors 3 and 4 are used for connection of wiring of other load circuits and so forth (not shown). The screw 5 is used for preventing the connectors 3 and 4 from causing disengagement ands thus maintains the main board 1 and the subsidiary board 2 in fixed condition. Also, the screw 5 serves as the power source line for connection between the power source IC 8 and the load circuits B10 and C11. Namely, the power source current 7 flowing from the power source IC 8 of the subsidiary board 2 flows into the load circuit A9 and the screw 5 via the power source pattern 12 as the power source line. The power source current 7 flowing in the screw 5 flows into the load circuit B10 and the load circuit C11 through the power source pattern 13 of the main board 1. The screw 5 and the power source patterns 12 and 13 are electrically connected upon fastening by the screw.

In the printed circuit board unit shown herein, only power source line is electrically connected by the screw 5. However, it is also possible to electrically connect the signal lines by another screw for fixing the main board 1 and the subsidiary board 2.

As set forth above, since the power source lines from the power source IC and/or the signal lines are electrically connected by the screw, number of pins of the connectors can be reduced in comparison with the case where the power source lines and the signal lines on the printed circuit boards are connected by only connectors as in the prior art.

Figure 4A:
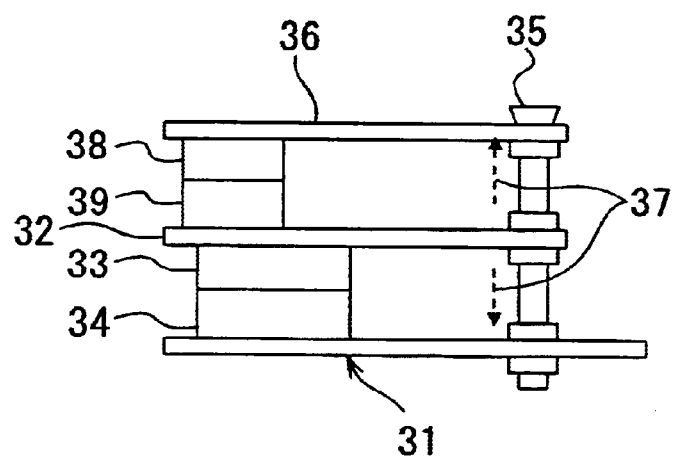
FIG. 4A is a front elevation of the second embodiment of a printed circuit board unit according to the present invention.
Figure 4B:
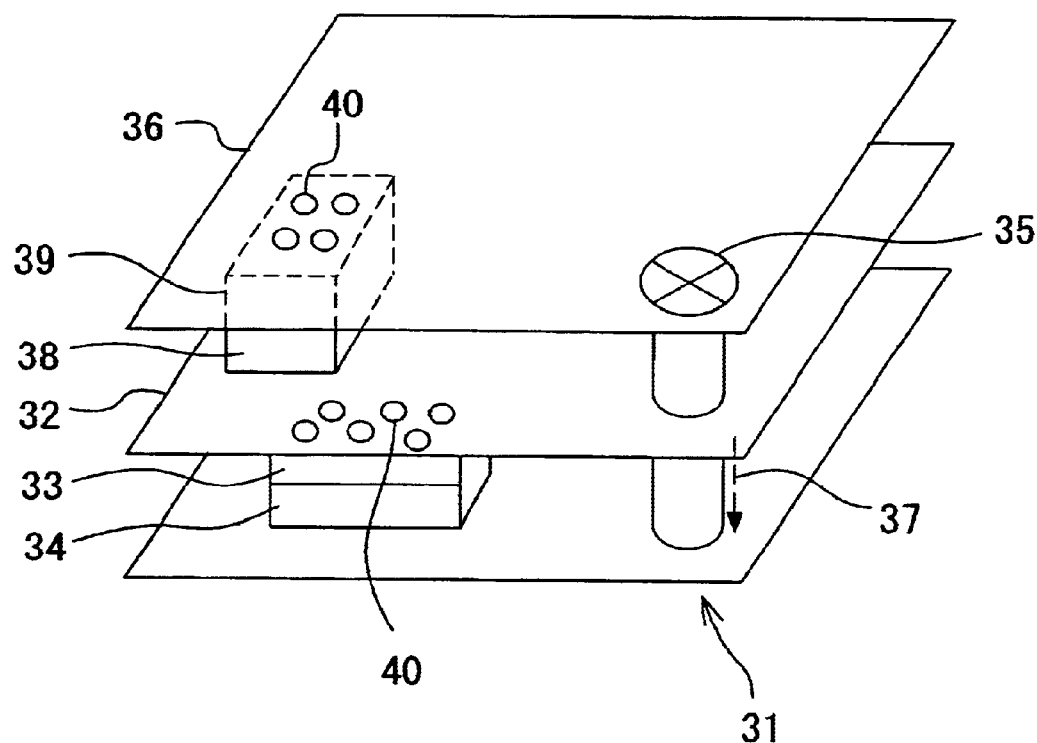
FIG. 4B is an enlarged perspective view of the second embodiment of a printed circuit board unit according to the present invention.
Figure 5A:
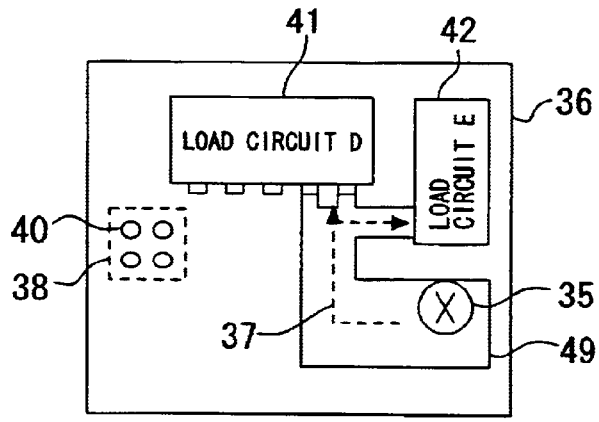
FIG. 5A is a plan view of a subsidiary board 36 of FIG. 4A.
Figure 5B:
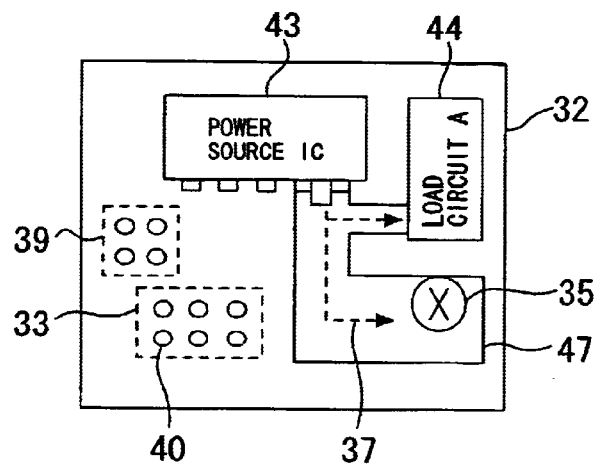
FIG. 5B is a plan view of a subsidiary board 32 of FIG. 4A.
Figure 5C:
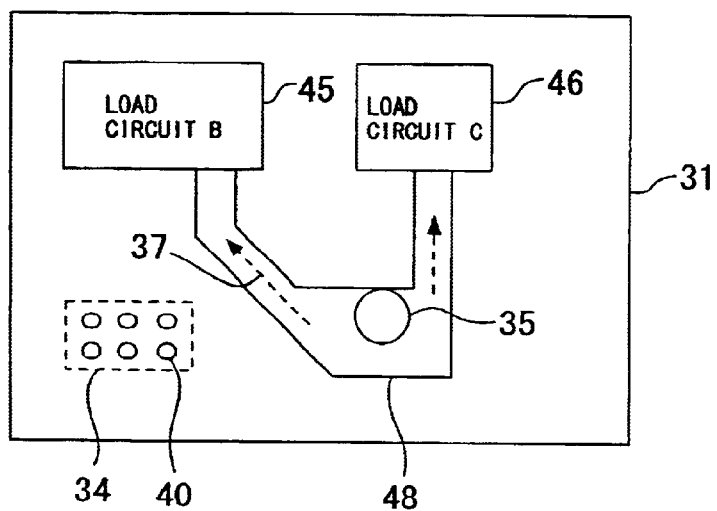
FIG. 5C is a plan view of a main board 1 of FIG. 4A.
Figure 6A:
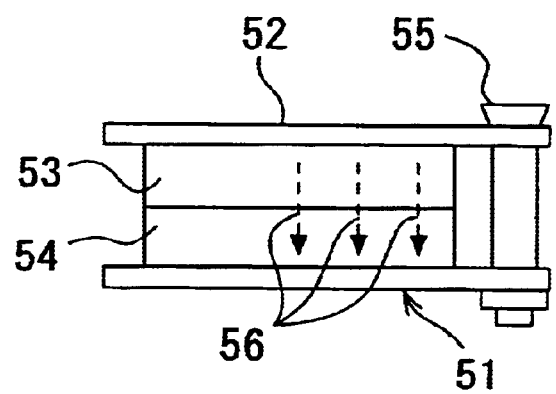
FIG. 6A is a plan view of the prior art.
Figure 6B:
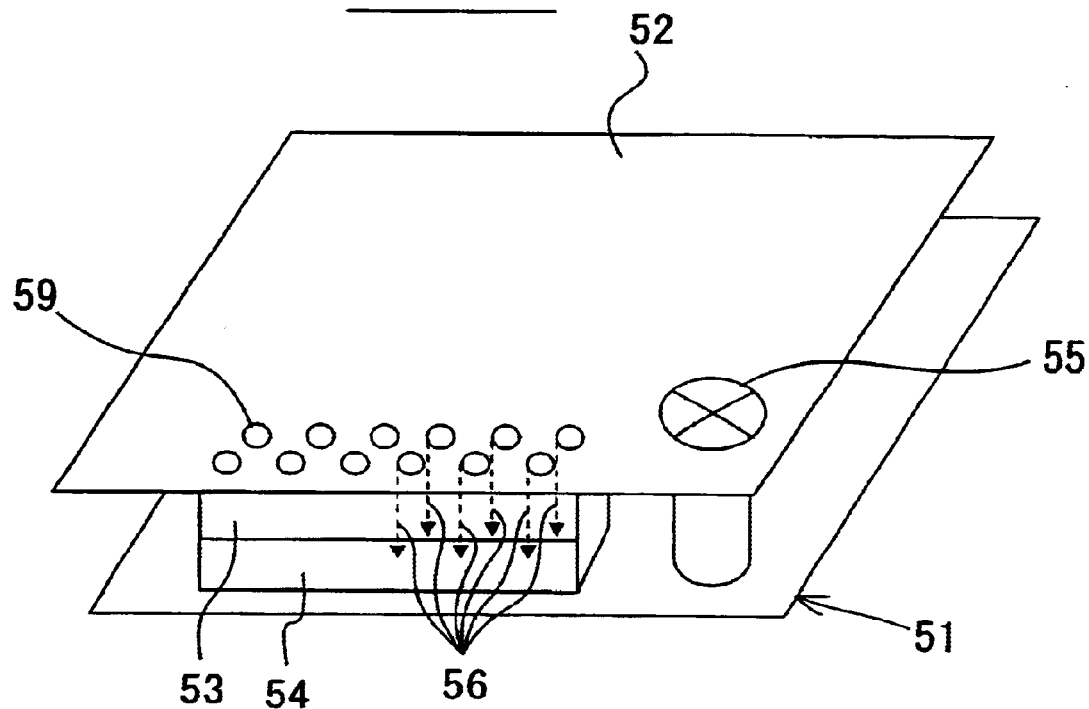
FIG. 6B is an enlarged perspective view of FIG. 6A.
Figure 7A:
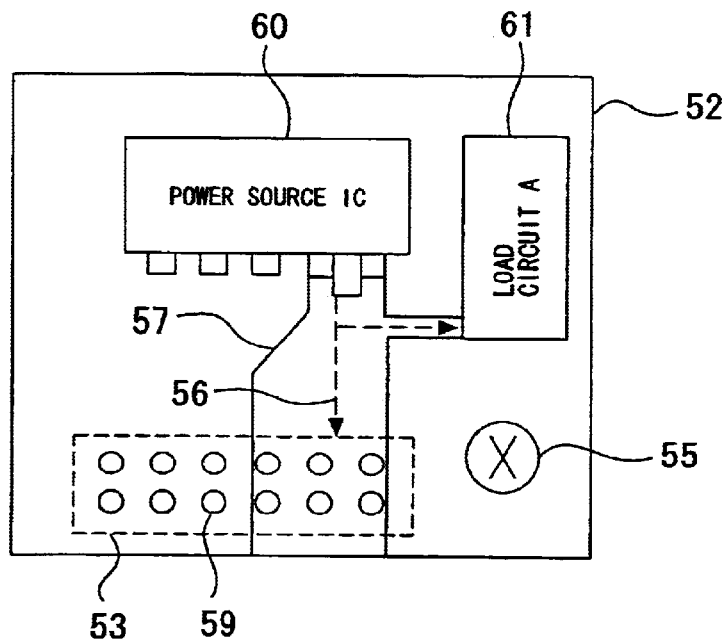
FIG. 7A is a plan view of a subsidiary board of FIG. 6A.
Figure 7B:
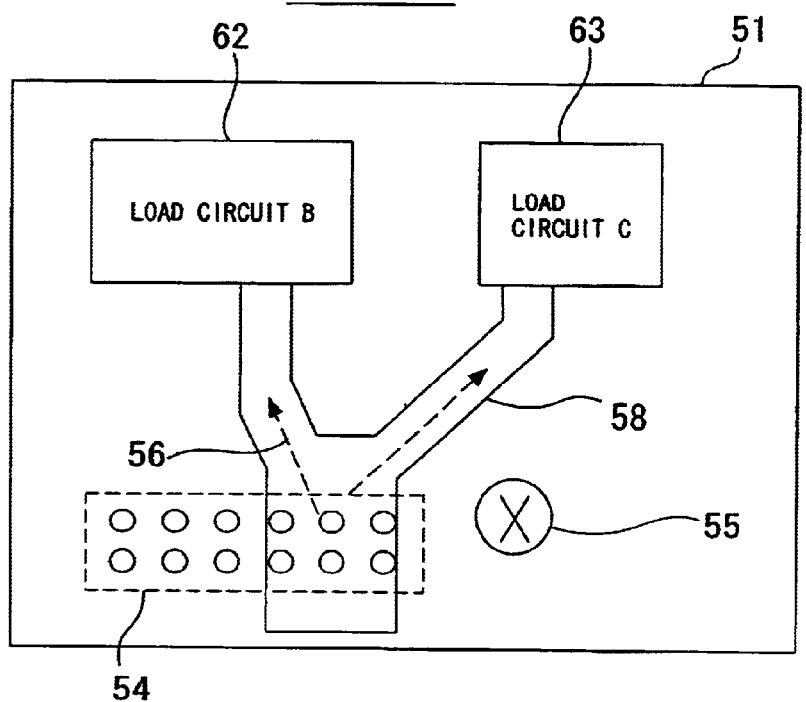
FIG. 7B is a plan view of a main board of FIG. 6A.

FIG. 4A is a front elevation of the second embodiment of a printed circuit board unit according to the present invention, FIG. 4B is an enlarged perspective view of the second embodiment of a printed circuit board unit according to the present invention, FIG. 5A is a plan view of a subsidiary board 36 of FIG. 4A, FIG. 5B is a plan view of a subsidiary board 32 of FIG. 4A, and FIG. 5C is a plan view of a main board 31 of FIG. 4A.

As shown in FIGS. 4A to 5C, the second embodiment of the printed circuit board unit is constructed with three printed circuit boards, namely a main board 31 and two subsidiary boards 32 and 36. Between the main board 31 and the subsidiary board 32, connectors 33 and 34 are disposed. Also, between the subsidiary board 32 and the subsidiary board 36, connectors 38 and 39 are disposed. Also, the main board 31 and the subsidiary boards 32 and 36 are fixed by means of a screw 35. Here, the screw 35 is formed of electrically conductive body (in this case, aluminum). On the other hand, a power source IC 43 and load circuits 41, 42, 44, 45 and 46 formed on the main board 31 and the subsidiary boards 32 and 36 are electrically connected by the screw 35 via power source patterns 47, 48 and 49. The power source IC and the load circuits (both are not shown) except for the power source IC 43 and the load circuits 41, 42, 44, 45 and 46 are electrically connected by the connectors 33, 34 and 38, 39. On the other hand, while not illustrated, the signal lines may also be electrically connected by the screw in similar manner as the power source lines.

Even in the shown embodiment of the printed circuit board unit, the power source lines from the power source IC is connected by the screw 35 and the signal lines are also connected through the screw. Therefore, number of pins of the connector can be reduced in comparison with the case where the wiring on the printed circuit boards are connected only by the connectors as in the prior art, to contribute for increasing of mounting space on the printed circuit board.

As set forth above, with the present invention, by establishing electrical interconnection of wiring on the printed circuit board by the screw formed of electrically conductive body which fixes the printed circuit board with each other, number of pins of the connectors for interconnection of wiring of the printed circuit boards can be reduced to contribute for increasing of mounting space on the printed circuit board.

Although the present invention has been illustrated and described with respect to exemplary embodiment thereof, it should be understood by those skilled in the art that the foregoing and various other changes, omission and additions may be made therein and thereto, without departing from the spirit and scope of the present invention. Therefore, the present invention should not be understood as limited to the specific embodiment set out above but to include all possible embodiments which can be embodied within a scope encompassed and equivalent thereof with respect to the feature set out in the appended claims.

What is claimed is:

1. A printed circuit board unit comprising:
   at least two circuit boards, each of the at least two circuit boards having one or more wiring patterns thereon, each wiring pattern including a plurality of wiring portions, at least one wiring portion on each circuit board being a combined signal line and power line;
   a connector operable to couple a plurality of the wiring portions of one of the at least two circuit boards to respective wiring portions of another of the at least two circuit boards; and
   a screw operable to couple the at least two circuit boards together and electrically connect a combined signal line and power line on one of the at least two circuit boards to a combined signal line and power line on another of the at least two circuit boards.

2. A printed circuit board unit according to claim 1, wherein the screw is formed of electrically conductive material.

3. A method for electrically and mechanically connecting at least two circuit boards, each of the at least two circuit boards having one or more wiring patterns thereon, each wiring pattern including a plurality of wiring portions, at least one wiring portion on each circuit board being a combined signal line and power line, the method comprising mechanically and electrically connecting the at least two circuit boards together such that:

a connector couples a plurality of the wiring portions of one of the at least two circuit boards to respective wiring portions of another of the at least two circuit boards;

a screw couples the at least two circuit boards together and electrically connects a combined signal line and power line on one of the at least two circuit boards to a combined signal line and power line on another of the at least two circuit boards.

4. A method according to claim 3, wherein the screw is formed of electrically conductive material.

5. A printed circuit board unit comprising:

at least two circuit boards, each of the at least two circuit boards having one or more wiring patterns thereon, each wiring pattern including a plurality of wiring portions, at least one wiring portion on each circuit board being a signal line and at least one wiring portion on each circuit board being a power line;

a connector operable to couple a plurality of the wiring portions of one of the at least two circuit boards to respective wiring portions of another of the at least two circuit boards; and a plurality of screws operable to couple the at least two circuit boards together and electrically connect at least one signal line and one power line on one of the at least two circuit boards to a respective signal line and power line on the other of the circuit boards.

6. A printed circuit board unit according to claim 5, wherein the screw is formed of electrically conductive material.

7. A method for electrically and mechanically connecting at least two circuit boards, each of the at least two circuit boards having one or more wiring patterns thereon, each wiring pattern including a plurality of wiring portions, at least one wiring portion on each circuit board being a signal line and at least one wiring portion on each circuit board being a power line, the method comprising mechanically and electrically connecting the pair of circuit boards together such that:

a connector couples a plurality of the wiring portions of one of the at least two circuit boards to respective wiring portions of another of the at least two circuit boards;

a plurality of screws couple the at least two circuit boards together and electrically connects at least one signal line and one power line on one of the at least two circuit boards to a respective signal line and power line on another of the at least two circuit boards.

8. A method accordingly to claim 7, wherein the screw is formed of electrically conductive material.

* * * * *